US010396076B2

(12) United States Patent
Jagannathan et al.

(10) Patent No.: US 10,396,076 B2
(45) Date of Patent: Aug. 27, 2019

(54) STRUCTURE AND METHOD FOR MULTIPLE THRESHOLD VOLTAGE DEFINITION IN ADVANCED CMOS DEVICE TECHNOLOGY

(71) Applicant: INTERNATIONAL BUSINESS MACHINES CORPORATION, Armonk, NY (US)

(72) Inventors: Hemanth Jagannathan, Niskayuna, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/464,436

(22) Filed: Mar. 21, 2017

(65) Prior Publication Data

US 2018/0277540 A1 Sep. 27, 2018

(51) Int. Cl.

| | | |
|---|---|---|
| *H01L 27/092* | (2006.01) | |
| *H01L 21/8234* | (2006.01) | |
| *H01L 21/02* | (2006.01) | |
| *H01L 29/423* | (2006.01) | |
| *H01L 21/28* | (2006.01) | |
| *H01L 29/161* | (2006.01) | |
| *H01L 29/49* | (2006.01) | |
| *H01L 27/11* | (2006.01) | |
| *H01L 29/10* | (2006.01) | |
| *H01L 21/8238* | (2006.01) | |

(52) U.S. Cl.
CPC .... *H01L 27/0922* (2013.01); *H01L 21/28088* (2013.01); *H01L 21/823431* (2013.01); *H01L 21/823807* (2013.01); *H01L 21/823821* (2013.01); *H01L 21/823842* (2013.01); *H01L 27/092* (2013.01); *H01L 27/0924* (2013.01); *H01L 29/1033* (2013.01); *H01L 29/161* (2013.01); *H01L 29/42392* (2013.01); *H01L 29/4966* (2013.01); *H01L 27/1104* (2013.01)

(58) Field of Classification Search
CPC ....... H01L 21/82345; H01L 21/823437; H01L 29/1054
USPC .................................................. 257/391, 392
See application file for complete search history.

(56) References Cited

U.S. PATENT DOCUMENTS

| | | | |
|---|---|---|---|
| 6,107,654 A | * | 8/2000 | Yamazaki ........... H01L 29/1054 257/194 |
| 6,380,590 B1 | | 4/2002 | Yu |
| 6,448,590 B1 | | 9/2002 | Adkisson et al. |

(Continued)

*Primary Examiner* — Victoria K. Hall
(74) *Attorney, Agent, or Firm* — Daniel P. Morris, Esq.; Hoffmann & Baron, LLP

(57) ABSTRACT

A method of fabricating a semiconductor structure having multiple defined threshold voltages includes: forming multiple field-effect transistor (FET) devices in the semiconductor structure, each of the FET devices including a channel and a gate stack formed of one of at least two different work function metals, the gate stack being formed proximate the channel; and varying a band-gap of the channel in each of at least a subset of the FET devices by controlling a percentage of one or more compositions of a material forming the channel; wherein a threshold voltage of each of the FET devices is configured as a function of a type of work function metal forming the gate stack and the percentage of one or more compositions of the material forming the channel.

10 Claims, 4 Drawing Sheets

(56) References Cited

U.S. PATENT DOCUMENTS

| | | | |
|---|---|---|---|
| 6,936,882 B1 | 8/2005 | Ahmed et al. | |
| 8,212,322 B2 | 7/2012 | Frank et al. | |
| 9,905,476 B2 * | 2/2018 | Bao | H01L 27/0924 |
| 9,922,977 B2 * | 3/2018 | Arghavani | H01L 21/82341 |
| 9,960,085 B2 * | 5/2018 | Chang | H01L 21/82384 |
| 10,056,302 B2 * | 8/2018 | Zhao | H01L 21/28088 |
| 2001/0048128 A1 * | 12/2001 | Yano | B82Y 10/00 |
| | | | 257/314 |
| 2002/0177279 A1 | 11/2002 | Adkisson et al. | |
| 2005/0095763 A1 * | 5/2005 | Samavedam | H01L 21/28079 |
| | | | 438/197 |
| 2005/0106789 A1 * | 5/2005 | Gottsche | H01L 21/28123 |
| | | | 438/163 |
| 2006/0286759 A1 * | 12/2006 | Xiong | H01L 27/0883 |
| | | | 438/351 |
| 2007/0207575 A1 * | 9/2007 | Taniguchi | H01L 21/82346 |
| | | | 438/199 |
| 2008/0303095 A1 * | 12/2008 | Xiong | H01L 21/845 |
| | | | 257/365 |
| 2011/0115026 A1 | 5/2011 | Jagannathan et al. | |
| 2011/0127616 A1 | 6/2011 | Hoentschel et al. | |
| 2012/0045876 A1 * | 2/2012 | Kawahara | H01L 21/82384 |
| | | | 438/231 |
| 2012/0056268 A1 * | 3/2012 | Mizutani | H01L 21/82385 |
| | | | 257/369 |
| 2012/0129330 A1 * | 5/2012 | Kim | H01L 21/28176 |
| | | | 438/591 |
| 2013/0049134 A1 * | 2/2013 | Sunamura | H01L 21/82384 |
| | | | 257/392 |
| 2013/0113042 A1 * | 5/2013 | Wang | H01L 21/82343 |
| | | | 257/347 |
| 2013/0228872 A1 * | 9/2013 | Bajaj | H01L 21/845 |
| | | | 257/369 |
| 2016/0254261 A1 * | 9/2016 | Machkaoutsan | H01L 21/321 |
| | | | 257/369 |
| 2016/0268387 A1 * | 9/2016 | Toh | |
| 2017/0033106 A1 * | 2/2017 | Walke | H01L 21/82380 |
| 2017/0084711 A1 * | 3/2017 | Lim | H01L 29/4966 |
| 2017/0110552 A1 * | 4/2017 | Lee | H01L 29/4966 |
| 2018/0083133 A1 * | 3/2018 | Bayram | H01L 29/7787 |

* cited by examiner

STRUCTURE AND METHOD FOR MULTIPLE THRESHOLD VOLTAGE DEFINITION IN ADVANCED CMOS DEVICE TECHNOLOGY

BACKGROUND OF THE INVENTION

The present invention relates generally to the electrical, electronic and computer arts, and, more particularly, to semiconductor structures.

Threshold voltage definition is probably one of the most critical parameters in complementary metal-oxide-semiconductor (CMOS) processing technology since it strongly determines the performance of CMOS devices with a given overdrive. In polysilicon/silicon oxynitride (SiON) technology, the threshold voltage was defined by a combination of well/halo/extension doping along with a doping of the gate. As high dielectric constant, or "high-K," metal gate technology was introduced, the gate doping knob was eliminated and replaced with the use of discrete work function metals, thus making it more challenging to obtain varying threshold voltages for a multitude of devices in a chip.

As semiconductor device scaling progresses, fully-depleted device technology is surfacing. In a fully-depleted device process technology, channel doping is less desired. Moreover, halo doping, which involves embedding ions into a material at the semiconductor surface at an angle that is not normal to the semiconductor surface, is not typically used. This makes threshold voltage definition heavily reliant on gate work function. Typically, technologists are forced to incorporate multiple work function metals to obtain desired threshold voltage devices, thereby making the integration of these various work function metals increasingly more difficult.

BRIEF SUMMARY

Principles of the invention, in accordance with one or more embodiments thereof, provide semiconductor structures and methods of obtaining a plurality of fin-type field-effect transistor (FinFET) devices having different discrete threshold voltages by the careful configuration of gate stack material and a channel in the semiconductor structure.

In accordance with one aspect, an exemplary method for fabricating a semiconductor structure having multiple defined threshold voltages includes: forming a plurality of field-effect transistor (FET) devices in the semiconductor structure, each of the FET devices comprising a channel and a gate stack formed of one of at least two different work function metals, the gate stack being formed proximate the channel; and varying a band-gap of the channel in each of at least a subset of the FET devices by controlling a percentage of one or more compositions of a material forming the channel; wherein a threshold voltage of each of the plurality of FET devices is configured as a function of a type of work function metal forming the gate stack and the percentage of one or more compositions of the material forming the channel.

In accordance with another aspect, an exemplary semiconductor structure having multiple defined threshold voltages includes a plurality of FET devices formed on a common substrate. Each of the FET devices comprises a channel and a gate stack formed of one of at least two different work function metals, the gate stack formed proximate the channel. A valence band offset and/or a band-gap of the channel in each of at least a subset of the FET devices is varied by controlling a percentage of one or more compositions of a material forming the channel. A threshold voltage of each of the FET devices is configured as a function of a type of work function metal forming the gate stack and the percentage of one or more compositions of the material forming the channel.

As may be used herein, "facilitating" an action includes performing the action, making the action easier, helping to carry the action out, or causing the action to be performed. For the avoidance of doubt, where an actor facilitates an action by other than performing the action, the action is nevertheless performed by some entity or combination of entities.

Techniques of the present invention can provide substantial beneficial technical effects. By way of example only and without limitation, one or more embodiments may provide one or more of the following advantages:

- combines the use of a silicon germanium (SiGe) channel along with a conventional silicon (Si) channel to obtain a large combination of threshold voltages;
- SiGe channels can be tuned to vary in band-gap by varying a percentage of germanium (Ge) incorporated therein;
- Valence band offset obtained by the Ge percentage variation directly impacts a threshold voltage of p-type field-effect transistor (PFET) devices;
- n-type field-effect transistor (NFET) device threshold voltage can also be varied, but to a smaller extent with SiGe channels;
- utilizes a smaller number of work function metals, compared to standard approaches, to obtain a larger than expected suite of threshold voltage options for a given technology node;
- eliminates the need for CMOS patterning in static random-access memory (SRAM) regions due to the use of different channel materials in these device regions, thereby relaxing lithography constraints on the technology.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

Figure 1:
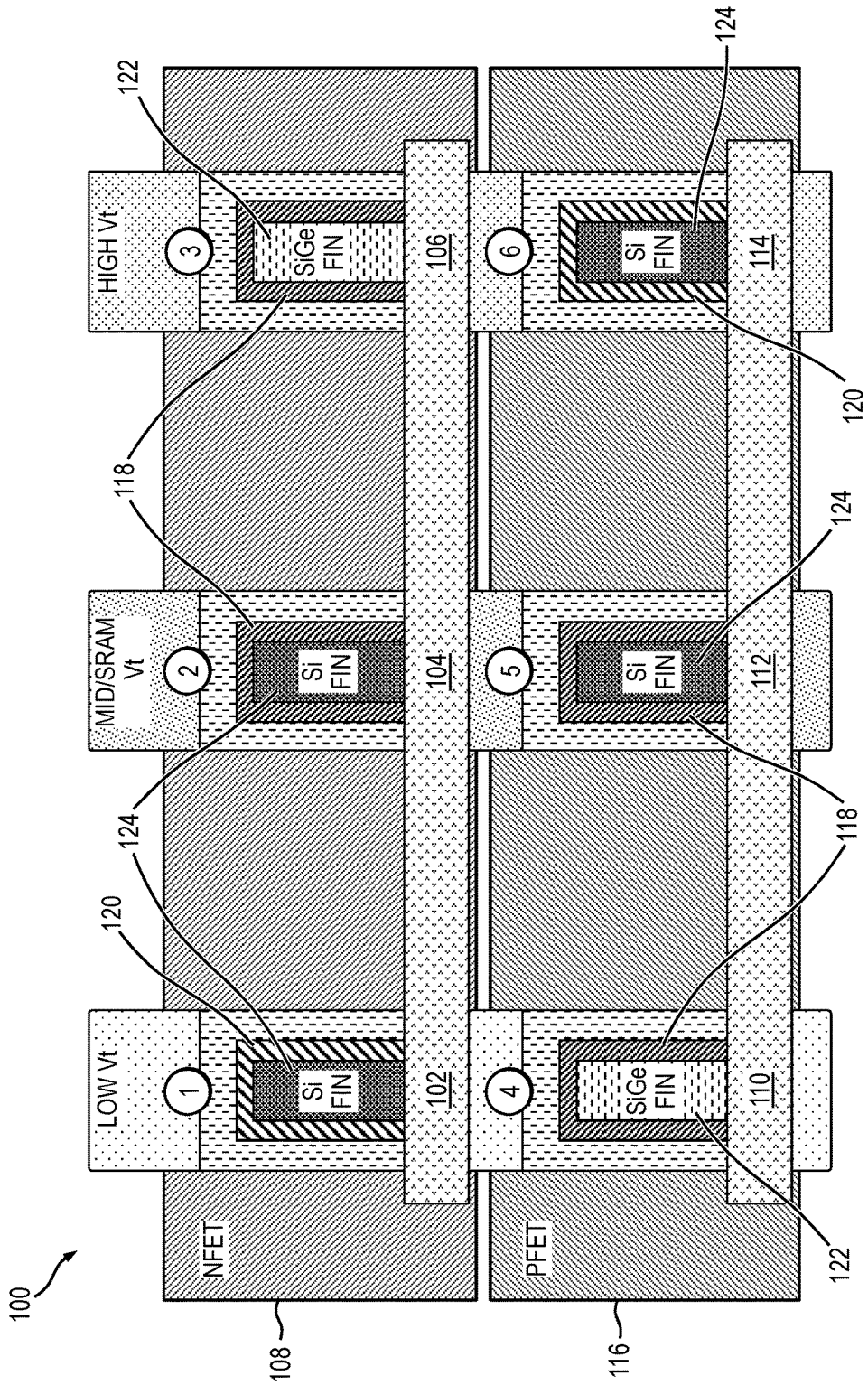
FIG. 1 is a top plan view conceptually depicting at least a portion of an exemplary semiconductor structure for multiple threshold voltage definition, according to an embodiment of the present invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative semiconductor structures and methods for obtaining a plurality of fin-type field-effect transistor (FinFET) devices having different threshold voltages by the novel use and reconfiguration of gate stack material and channel material in the semiconductor structure. It is to be appreciated, however, that the invention is not limited to the specific structures and/or methods illustratively shown and described herein. For example, exemplary FinFET device structures are shown for illustrative purposes, but it is to be appreciated that aspects according to embodiments of the invention can be similarly extended to planar and other non-planar devices as well. Furthermore, illustrative embodiments shown and described herein utilize silicon germanium (SiGe) and silicon (Si) as channel materials but may also be extended to alternative channel materials. Thus, it will become apparent to those skilled in the art given the teachings herein that numerous modifications can be made to the embodiments shown that are within the scope of the claimed invention. That is, no limitations with respect to the embodiments shown and described herein are intended or should be inferred.

Although the overall fabrication method and the structures formed thereby are entirely novel, certain individual processing steps required to implement a method in accordance with one or more embodiments of the invention may utilize conventional semiconductor fabrication techniques and conventional semiconductor fabrication tooling. These techniques and tooling will already be familiar to one having ordinary skill in the relevant arts given the teachings herein. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are both hereby incorporated by reference herein. It is emphasized that while some individual processing steps may be set forth herein, those steps are merely illustrative, and one skilled in the art may be familiar with several equally suitable alternatives that would also fall within the scope of the invention.

It is to be appreciated that the various layers and/or regions shown in the accompanying figures may not be drawn to scale. Furthermore, one or more semiconductor layers of a type commonly used in such integrated circuit devices may not be explicitly shown in a given figure for brevity and/or clarity. This does not imply that the semiconductor layer(s) not explicitly shown are omitted in the actual integrated circuit device.

As previously stated, threshold voltage definition is probably one of the most critical parameters in complementary metal-oxide-semiconductor (CMOS) processing technology, since it strongly determines the performance of CMOS devices with a given overdrive. In traditional polysilicon/silicon oxynitride technologies, threshold voltage was defined by a combination of well/halo/extension doping as well as a doping of the gate. As high dielectric constant (high-K) metal gate technology was introduced, designers were completely reliant on other ways of changing the work function and threshold voltage of the device.

Aspects of the present invention, in one or more embodiments thereof, beneficially control or tune a band-gap and/or a valance band offset between at least two different channel materials in a field-effect transistor (FET) device to provide FET devices having different threshold voltages on the same substrate. Although the illustrative embodiments shown and described herein employ silicon (Si) and silicon germanium (SiGe) channels in FinFET devices, embodiments of the invention are not limited to Si and SiGe. Rather, aspects of the invention apply similarly to any two or more different channel materials wherein a valence band or conduction band offset exists in one material with respect to the other material(s). Furthermore, aspects in accordance with one or more embodiments of the invention are not limited to FinFET devices, but rather may be utilized with other device types, such as, for example, planar devices, other non-planar devices, gate all-around devices, etc.

In the case of semiconductor devices employing SiGe channels, there is a valence band offset, the extent of which is controlled as a function of the percentage of germanium (Ge) in the material, and such valence band offset tends to impact the threshold voltage of PFET devices to a significantly greater degree compared to NFET devices. Although there should be essentially no impact of the valence band offset on an NFET device, primarily because the conduction band of SiGe is fairly close to that of Si, in practice the threshold voltage of the NFET can still be varied by a small extent by varying the valence band offset of the SiGe channel. In other words, for devices having Si and SiGe channels and using the same gate stack, at least two different threshold voltages are expected for both NFET and PFET devices, with the PFET threshold voltage being modulated by the channel to a much larger extent compared to the NFET threshold voltage. Embodiments of the invention use this novel concept along with a minimal number of work function metals (and corresponding metal patterning) to obtain a larger than expected suite of threshold voltage options for a given technology node. Moreover, in a static random access memory (SRAM) application, one or more embodiments beneficially eliminate the need for CMOS patterning in SRAM regions due, at least in part, to the use of different channel materials in these device regions, thereby relaxing the lithography constraints on the technology.

FIG. 1 is a top plan view conceptually depicting at least a portion of an exemplary semiconductor structure 100 for multiple threshold voltage definition, according to an embodiment of the present invention. The semiconductor structure 100, in this embodiment, comprises a plurality of n-type FinFET devices, 102, 104 and 106, fabricated in an n-type region 108 of a semiconductor substrate, and a plurality of p-type FinFET devices, 110, 112 and 114, fabricated in a p-type region 116 of the substrate. Using only one metal patterning level with two different work function metals for forming a gate stack of each of the FinFET devices, six different threshold voltages can be obtained.

The semiconductor structure 100 employs two different gate stacks; namely, a first gate stack (gate stack 1) 118 and a second gate stack (gate stack 2) 120. The two gate stacks 118, 120 can be formed using one metal patterning level, wherein a first metal layer is deposited, then stripped off in a desired region(s) of the semiconductor structure, followed by deposition of a second metal layer, as will be understood by those skilled in the art. The first gate stack 118, in one or more embodiments, preferably provides a mid-gap work function voltage—i.e., midway between a low-threshold voltage ($V_t$) FET and a high-$V_t$ FET—on silicon, and may comprise, for example, titanium nitride (TiN), tantalum nitride (TaN), or the like. When gate stack values are closer to the NFET band-edge (nBE) (i.e., near a conduction band of the channel material), they are for n-type work function (nWF) metals or low-threshold voltage (low-$V_t$) devices for NFETs; when gate stack values are closer to the PFET band-edge (pBE) (i.e., near a valence band of the channel material), they are for p-type work function (pWF) metals or low-$V_t$ devices for PFETs. The second gate stack 120, in one or more embodiments, preferably provides an nWF which is closer to the nBE (e.g., about 4.2-4.3 electron volts (eV)), and may comprise, for example, titanium aluminum carbide (TiAlC), tantalum aluminum carbide (TaAlC), or the like. It is to be appreciated that embodiments of the invention are not limited to any specific work function materials used to form the gate stacks 118, 120. As shown in FIG. 1, NFET device 102 and PFET device 114 are fabricated using the second gate stack 120, while NFET devices 104 and 106 and PFET devices 110 and 112 are fabricated using the first gate stack 118.

As previously stated, an important aspect of embodiments of the invention combines the use of a SiGe channel 122 and a Si channel 124, along with multiple work function gate stacks, to obtain a large suite of available threshold voltages. The SiGe channels are essentially tuned or otherwise modified as desired, according to one or more embodiments, to vary in band-gap by controlling the percentage of Ge incorporated in them. The valence band offset obtained by modulating the percentage of Ge in the SiGe channel directly impacts the threshold voltage of the PFET devices and, to a lesser extent, impacts the threshold voltage of the NFET devices as well.

With continued reference to FIG. 1, the semiconductor structure 100 comprises six FinFET devices (FETs), each having a different threshold voltage. The first n-type FinFET device 102 is formed using the second gate stack 120 and having an Si fin channel 124 and is referred to as gate stack combination 1, the second n-type FinFET device 104 is formed using the first gate stack 118 and having an Si fin channel 124 and is referred to as gate stack combination 2, and the third n-type FinFET device 106 is formed using the first gate stack 118 and having a SiGe fin channel 122 and is referred to as gate stack combination 3. Likewise, the first p-type FinFET device 110 is formed using the first gate stack 118 and having a SiGe fin channel 122 and is referred to as gate stack combination 4, the second p-type FinFET device 112 is formed using the first gate stack 118 and having an Si fin channel 124 and is referred to as gate stack combination 5, and the third p-type FinFET device 114 is formed using the second gate stack 120 and having an Si fin channel 124 and is referred to as gate stack combination 6.

Figure 2:
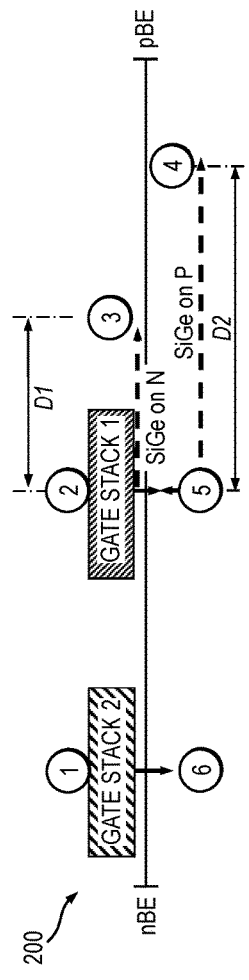
FIG. 2 is a relational graph conceptually depicting an illustrative effect on threshold voltage resulting from combinations of gate stacks and channel materials used in the exemplary semiconductor structure shown in FIG. 1, according to an embodiment of the invention.

FIG. 2 is a relational graph 200 which conceptually depicts an exemplary effect on threshold voltage resulting from the various combinations of gate stacks and channel materials for the illustrative semiconductor structure 100 shown in FIG. 1, according to an embodiment of the invention. In this embodiment, gate stack combination 1 yields a low NFET threshold voltage and gate stack combination 3 yields a high NFET threshold voltage. Similarly, gate stack combination 4 yields a low PFET threshold voltage and gate stack combination 6 yields a high PFET threshold voltage. Gate stack combinations 2 and 5 yield mid-gap (or SRAM) NFET and PFET threshold voltages, respectively. As previously explained, a mid-gap threshold voltage is defined somewhere between a low threshold voltage and a high threshold voltage FET. Gate stack combinations above the nBE-pBE line (e.g., gate stack combinations 1 through 3) are associated with NFET devices and gate stack combinations below the nBE-pBE line (e.g., gate stack combinations 4 through 6) are associated with PFET devices.

For an NFET device, such as NFET 106 shown in FIG. 1, using a SiGe fin channel with the first gate stack (gate stack combination 3) will produce a higher threshold voltage device compared to an NFET device, such as NFET 104, using the same gate stack but with an Si fin channel (gate stack combination 2). This is depicted in the relational graph 200 of FIG. 2, which illustrates gate stack combination 3 pushed closer to the pBE compared to gate stack combination 2. A difference, D1, between the threshold voltage of the NFET using gate stack combination 3 and the NFET using gate stack combination 2 can be controlled as a function of the percentage of Ge in the SiGe fin channel. Alternatively, for a PFET device, such as PFET 110 in FIG. 1, using a SiGe fin channel with the first gate stack (gate stack combination 4) produces a lower threshold voltage compared to a PFET device, such as PFET 112, using the same gate stack but with an Si fin channel (gate stack combination 5). This is depicted in the relational graph 200 of FIG. 2, which illustrates gate stack combination 4 pushed closer to the pBE compared to gate stack combination 5. Again, a difference, D2, between the threshold voltage of the PFET using gate stack combination 4 and the PFET using gate stack combination 5 is controlled as a function of the percentage of Ge in the SiGe fin channel. When a PFET or NFET device having a mid-gap threshold voltage is desired, a SiGe fin channel is not necessary; rather, a Si channel can be used, in one or more embodiments, shown as gate stack combinations 2 and 5 in FIG. 2.

Figure 4:
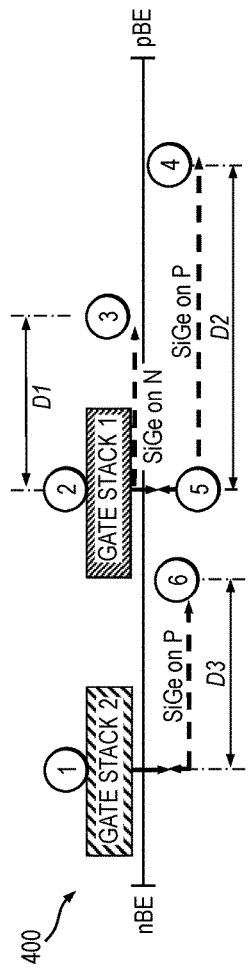
FIG. 4 is a relational graph conceptually depicting an illustrative effect on threshold voltage resulting from combinations of gate stacks and channel materials used in the exemplary semiconductor structure shown in FIG. 3, according to an embodiment of the invention.
Figure 3:
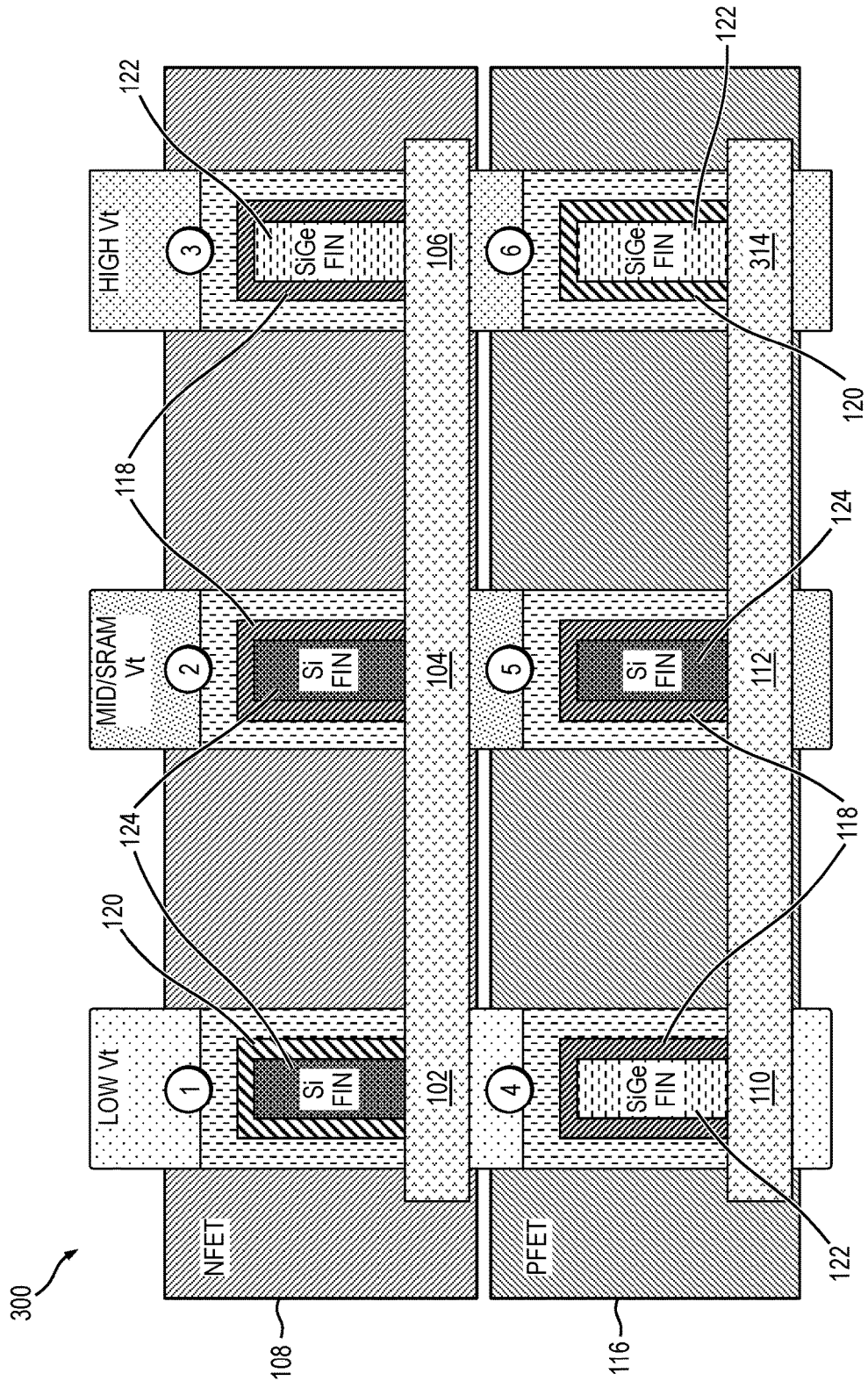
FIG. 3 is a top plan view conceptually depicting at least a portion of an exemplary semiconductor structure for multiple threshold voltage definition, according to another embodiment of the present invention.

FIG. 3 is a top plan view conceptually depicting at least a portion of an exemplary semiconductor structure 300 for multiple threshold voltage definition, according to another embodiment of the present invention. The semiconductor structure 300 is essentially the same as semiconductor structure 100 shown in FIG. 1, except that the Si fin channel 124 used by PFET 114 in FIG. 1 has been replaced with a SiGe fin channel 122 in p-type FinFET device 314. PFET device 314, like PFET device 114, utilizes the second gate stack 120. By substituting the Si channel with a SiGe channel, the threshold voltage of PFET device 314 is lowered so that it is closer to a mid-gap threshold voltage. This is illustrated in FIG. 4, which is a relational graph 400 conceptually depicting an effect on threshold voltage resulting from combinations of gate stacks and channel materials used in the exemplary semiconductor structure 300 shown in FIG. 3, according to an embodiment of the invention. With reference now to FIG. 4, it is apparent that gate stack combination 6, representing PFET device 314 in FIG. 3, yields a threshold voltage that is lowered to be closer to the PFET mid-gap threshold voltage exhibited by gate stack combination 5, representing PFET device 112 in FIG. 3. A voltage difference, D3, between the threshold voltage of PFET device 114 in FIG. 1 and PFET device 314 in FIG. 3 can be controlled (i.e., tuned) as a function of the percentage of Ge in the SiGe channel material, as previously stated.

Figure 5:
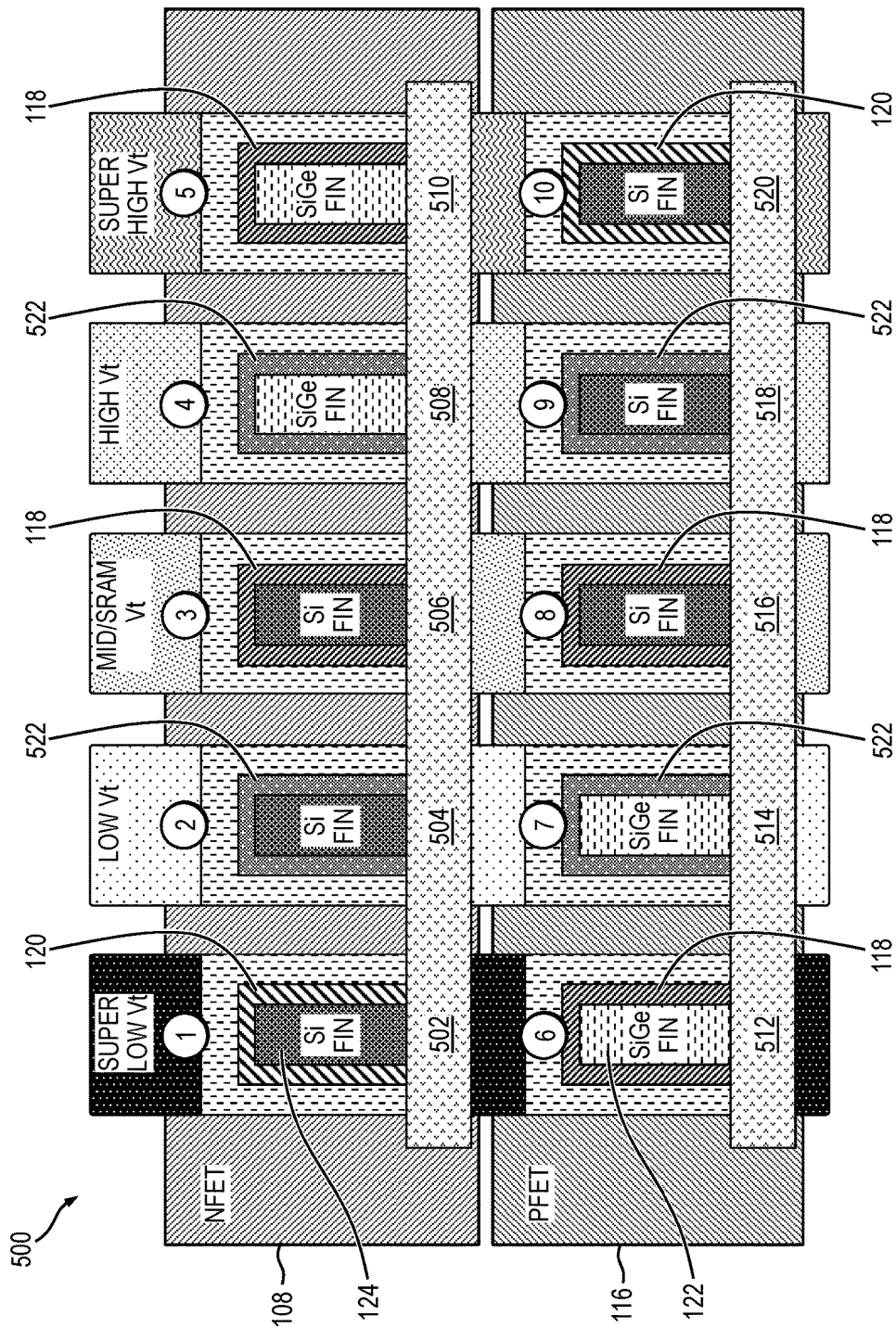
FIG. 5 is a top plan view conceptually depicting at least a portion of an exemplary semiconductor structure for multiple threshold voltage definition, according to yet another embodiment of the present invention.

By way of example only and without limitation, adding a third gate stack increases the suite of available threshold voltages to ten, compared to the six different threshold voltages offered by the semiconductor structures 100 and 300 shown in FIGS. 1 and 3, respectively. Specifically, FIG. 5 is a top plan view conceptually depicting at least a portion of an exemplary semiconductor structure 500 for multiple threshold voltage definition, according to yet another embodiment of the invention. The semiconductor structure 500, in this embodiment, includes five n-type FinFET devices, 502, 504, 506, 508 and 510, and five p-type FinFET devices, 512, 514, 516, 518 and 520. Each of the devices 502 through 520 has a different threshold voltage relative to one another.

In order to obtain the different threshold voltages, the semiconductor structure 500 introduces a third gate stack (gate stack 3) 522, in addition to the first and second gate stacks 118 and 120, respectively. The third gate stack 522, in this embodiment, comprises a metal having a work function that is preferably between the work function values of the first and second gate stacks (e.g., about 4.4 eV-4.5 eV), although it is to be understood that the invention is not limited to any specific work function of the gate stack materials. The three gate stacks 118, 120, 522 are fabricated, in one or more embodiments, using two metal patterning levels, as will be understood by those skilled in the art.

With reference to FIG. 5, n-type FinFET device 502 is formed using the second gate stack 120 and having an Si fin channel 124 and is referred to as gate stack combination 1, n-type FinFET device 504 is formed using the third gate stack 522 and having an Si fin channel 124 and is referred to as gate stack combination 2, n-type FinFET device 506 is formed using the first gate stack 118 and having an Si fin channel 124 and is referred to as gate stack combination 3, n-type FinFET device 508 is formed using the third gate stack 522 and having a SiGe fin channel 122 and is referred to as gate stack combination 4, and n-type FinFET device 510 is formed using the first gate stack 118 and having a SiGe fin channel 122 and is referred to as gate stack combination 5. Similarly, p-type FinFET device 512 is formed using the first gate stack 118 and having a SiGe fin channel 122 and is referred to as gate stack combination 6, p-type FinFET device 514 is formed using the third gate stack 522 and having a SiGe fin channel 122 and is referred to as gate stack combination 7, p-type FinFET device 516 is formed using the first gate stack 118 and having an Si fin channel 124 and is referred to as gate stack combination 8, p-type FinFET device 518 is formed using the third gate stack 522 and having an Si fin channel 124 and is referred to as gate stack combination 9, and p-type FinFET device 520 is formed using the second gate stack 120 and having an Si fin channel 124 and is referred to as gate stack combination 10.

Using the illustrative arrangement depicted in FIG. 5, FETs 502 and 512 will have the lowest NFET and PFET threshold voltages ("Super Low $V_t$"), respectively, and FETs 510 and 520 will have the highest NFET and PFET threshold voltages ("Super High $V_t$"), respectively, relative to the other FET devices in the semiconductor structure 500. FETs 506 and 516 will have mid-gap NFET and PFET threshold voltages, respectively, FETs 504 and 514 will have NFET and PFET threshold voltages, respectively, that are between the lowest threshold voltages and the mid-gap threshold voltages ("Low $V_t$"), and FETs 508 and 518 will have NFET and PFET threshold voltages, respectively, that are between the mid-gap threshold voltages and the highest threshold voltages ("High $V_t$").

Figure 6:
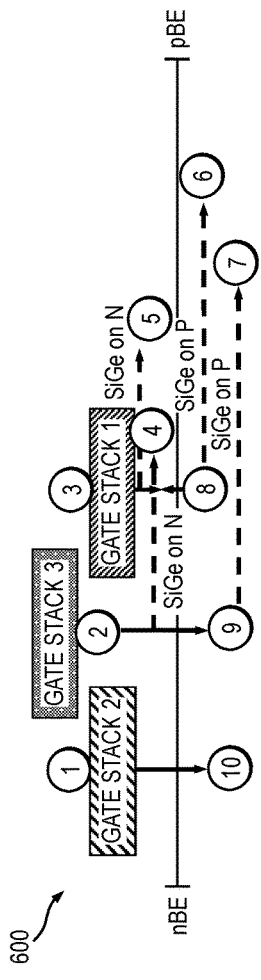
FIG. 6 is a relational graph conceptually depicting an illustrative effect on threshold voltage resulting from combinations of gate stacks and channel materials used in the exemplary semiconductor structure shown in FIG. 5, according to an embodiment of the invention.

FIG. 6 is a relational graph 600 conceptually depicting an illustrative effect on threshold voltage resulting from combinations of gate stacks and channel materials used in the exemplary semiconductor structure 500 shown in FIG. 5, according to an embodiment of the invention. As apparent from FIG. 6, gate stack combinations 1 and 10, which utilize gate stack 2 and a Si fin channel, are positioned closest to the nBE, and therefore exhibit the lowest NFET and the highest PFET threshold voltages, respectively, relative to the other FETs in the semiconductor structure 500. Gate stack combinations 2 and 9, which utilize gate stack 3 and a Si fin channel, exhibit a slightly higher NFET threshold voltage and a slightly lower PFET threshold voltage, respectively, relative to gate stack combinations 1 and 10. Gate stack combination 4, which also utilizes gate stack 3 but replaces the Si fin channel with a SiGe fin channel, yields an NFET device having a threshold voltage which is higher compared to gate stack combination 2, as evidenced by its position closer to the pBE. Likewise, gate stack combination 7, which also utilizes gate stack 3 but replaces the Si fin channel with a SiGe fin channel, yields a PFET device having a threshold voltage which is lower compared to gate stack combination 9, as evidenced by its position closer to the pBE. Gate stack combinations 3 and 8, which utilize gate stack 1 and an Si fin channel, exhibit mid-gap NFET and PFET threshold voltages, respectively. By replacing the Si fin channel with a SiGe fin channel and using the same gate stack 2, as represented by gate stack combination 5, an NFET device having a higher threshold voltage than mid-gap is produced, as evidenced by the position of gate stack combination 5 closer to the pBE relative to gate stack combination 3; in this example, gate stack combination 5 produces the highest NFET threshold voltage of the FET devices in the semiconductor structure 500. Likewise, by replacing the Si fin channel with a SiGe fin channel and using the same gate stack 1, as represented by gate stack combination 6, a PFET device having a lower threshold voltage than mid-gap is produced, as evidenced by the position of gate stack combination 6 closer to the pBE relative to gate stack combination 8; in this example, gate stack combination 6 produces the lowest PFET threshold voltage of the FET devices in the semiconductor structure 500.

As apparent from FIGS. 1 through 6, for a small amount of added processing complexity, by leveraging the different work function metals forming the gate stacks and the different channel materials, a semiconductor structure having a greater number of defined threshold voltages can be achieved. Furthermore, by varying the composition percentage of the channel material (e.g., in the case of a SiGe channel, modulating the percentage of Ge), one or more of the threshold voltages can be advantageously targeted to a prescribed technology specification.

Although aspects according to embodiments of the invention have been described herein in the context of fabricating a FinFET device, a straightforward extension of these aspects can be used to fabricate other device types, including, for example, planar transistor devices, other non-planar transistor devices, gate all-around transistor devices, etc., as will become apparent to those skilled in the art given the teachings herein. For example, in one or more other embodiments, a planar transistor device is fabricated wherein instead of forming SiGe fins, as in the context of a FinFET device, SiGe planar regions serve as a channel of the planar transistor device.

Given the discussion thus far, it will be appreciated that, in general terms, an exemplary method for forming a CMOS semiconductor structure having a multiple threshold voltage definition, according to an embodiment of the invention, includes forming a plurality of field-effect transistor (FET) devices in the semiconductor structure, each of the FET devices comprising a channel and a gate stack formed of one of at least two different work function metals, the gate stack being formed proximate the channel; and varying a band-gap of the channel in each of at least a subset of the FET devices by controlling a percentage of one or more compositions of a material forming the channel; wherein a threshold voltage of each of the plurality of FET devices is configured as a function of a type of work function metal forming the gate stack and the percentage of one or more compositions of the material forming the channel.

Given the discussion thus far, it will also be appreciated that an exemplary semiconductor structure having a multiple threshold voltage definition includes a plurality of FET devices formed on a common substrate. Each of the FET devices includes a channel and a gate stack formed of one of at least two different work function metals, the gate stack formed proximate the channel. A valence band offset and/or a band-gap of the channel in each of at least a subset of the FET devices is varied by controlling a percentage of one or more compositions of a material forming the channel. A threshold voltage of each of the FET devices is configured as a function of a type of work function metal forming the gate stack and the percentage of one or more compositions of the material forming the channel.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having devices with multiple defined threshold voltages therein formed in accordance with one or more embodiments of the invention.

An integrated circuit in accordance with aspects of the present disclosure can be employed in essentially any application which requires a semiconductor structure having a multiple threshold voltage definition, such as, but not limited to, processors, mobile chips, portable electronic devices, power control devices, etc. Suitable systems for implementing embodiments of the invention may include, but are not limited to, consumer electronics, communications systems, computing systems, etc. Applications and systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A method of forming a semiconductor structure having multiple defined threshold voltages, the method comprising:
   forming a plurality of field-effect transistor (FET) devices in the semiconductor structure, each of the FET devices comprising a channel and a gate stack formed of one of at least two different work function metals, the gate stack being formed proximate the channel;
   forming each gate stack in each of at least a subset of the plurality of FET devices by using a single metal patterning level and two different work function metals in a given region of a same conductivity type in the semiconductor structure; and
   varying a valence band offset and a conduction band offset of the channel in each of the at least a subset of the FET devices in the given region of the same conductivity type in the semiconductor structure by controlling a percentage of one or more compositions of a material forming the channel;
   wherein a threshold voltage of each of the plurality of FET devices is configured as a function of a type of work function metal forming the gate stack of the corresponding FET device and the percentage of one or more compositions of the material forming the channel.

2. The method of claim 1, wherein each of at least a subset of the plurality of FET devices comprises a silicon germanium channel, and wherein varying at least one of the valence band offset and the band-gap of the channel comprises varying a percentage of germanium in the silicon germanium channel.

3. The method of claim 1, wherein a first subset of the plurality of FET devices comprises at least one n-type FinFET device and a second subset of the plurality of FET devices comprises at least one p-type FinFET device.

4. The method of claim 1, wherein a first subset of the plurality of FET devices comprises at least one n-type planar transistor device and a second subset of the plurality of FET devices comprises at least one p-type planar transistor device.

5. The method of claim 1, wherein a first subset of the plurality of FET devices comprises at least one n-type non-planar gate all-around transistor device, and a second subset of the plurality of FET devices comprises at least one p-type non-planar gate all-around transistor device.

6. The method of claim 1, wherein forming the plurality of FET devices in the semiconductor structure comprises forming each of the at least a subset of the plurality of FET devices having a channel comprising at least first and second channel materials, wherein the valence band and conduction band offsets exist in the first channel material with respect to the second channel material.

7. The method of claim 1, wherein forming the plurality of FET devices comprises forming at least first and second gate stacks corresponding to at least two of the plurality of FET devices, the first and second gate stacks being formed by depositing a first metal layer, stripping off the first metal layer in one or more prescribed regions of the semiconductor structure, and depositing a second metal layer, the first and second metal layers being deposited using the same metal patterning level.

8. The method of claim 7, further comprising configuring the first gate stack to have a work function voltage that is midway between a low-threshold voltage ($V_t$) FET device and a high-$V_t$ FET device, and configuring the second gate stack to have a work function voltage that is near a conduction band or valence band of the material forming the channel.

9. The method of claim 8, wherein the first gate stack comprises one of titanium nitride and tantalum nitride, and the second gate stack comprises one of titanium aluminum carbide and tantalum aluminum carbide.

10. The method of claim 1, wherein for each metal patterning level used in forming the gate stack in each of at least a subset of the plurality of FET devices, more than two different defined threshold voltages are obtained.

* * * * *